United States Patent [19]

Itoh et al.

[11] 4,016,505

[45] Apr. 5, 1977

[54] DOUBLE HETEROSTRUCTURE SEMICONDUCTOR LASER

[75] Inventors: Kunio Itoh; Morio Inoue, both of Takatsuki, Japan

[73] Assignee: Matsushita Electronics Corporation, Oaza-Kadoma, Japan

[22] Filed: Aug. 28, 1975

[21] Appl. No.: 608,714

Related U.S. Application Data

[63] Continuation-in-part of Ser. No. 453,150, March 20, 1974, abandoned.

[30] Foreign Application Priority Data

Mar. 20, 1973 Japan .............................. 47-32362
Mar. 20, 1973 Japan .............................. 47-32363

[52] U.S. Cl. ............................ 331/94.5 H; 357/16; 357/18
[51] Int. Cl.² ......................................... H01S 3/19
[58] Field of Search .......... 357/16, 18; 331/94.5 H; 330/4.3

[56] References Cited

UNITED STATES PATENTS 3,456,209 7/1969 Diemer ....................... 331/94.5 H
3,911,376 10/1975 Thompson ................... 331/94.5 H

*Primary Examiner*—Robert J. Webster
*Attorney, Agent, or Firm*—Cushman, Darby & Cushman

[57] ABSTRACT

A double-heterostructure injection laser can be improved to have a low threshold current. The improvement is obtained when the active region of GaAs or $Ga_{1-y}Al_yAs$ consists of several component layers wherein the central layer has the highest carrier concentrations and the layers on both sides of the central layer have lower carrier concentrations and the farther the outer layers are apart from the central layer, the lower are their carrier concentrations.

By forming the active region in this manner, the light generated in the active region is well confined in the region without undesirable leaking, resulting in a considerable lowering of the threshold current.

2 Claims, 8 Drawing Figures

DOUBLE HETEROSTRUCTURE SEMICONDUCTOR LASER

BACKGROUND OF THE INVENTION

This is a continuation-in-part of Application Ser. No. 453,150, filed Mar. 20, 1974 now abandoned. This invention relates to an improvement in a double-heterostructure injection laser.

Since a double-heterostructure semiconductor laser hereinafter referred to as a DHS laser was developed, threshold currents have been prominently decreased and lasing on a continuous wave basis at room temperature has become possible. Such a laser diode, as shown in FIG. 1, is made by sequential epitaxial growths of the first region 2 of n-type $Ga_{1-x}Al_xAs$, the second region 3 of GaAs, the third region 4 of p-type $Ga_{1-x'}Al_{x'}As$, and a fourth region 5 of $p^+$-type GaAs, on an n-type GaAs substrate 1. The reference numeral 1' designates an ohmic contact face to contact an electrode, and numeral 1'' designates a cleaved surface. (The values of $x$ and $x'$ range from 0.2 - 0.8).

This DHS laser is capable of confining the carrier as well as a generated laser light in the active region, and therefore, its efficiency is very high. The locations of the layers 2, 3, 4, energy levels of the layers and refractive indexes are shown in FIGS. 2(a), (b) and (c), respectively. In such a DHS semiconductor laser provided with a GaAs active region, it is known that the threshold current decreases when the thickness of the active region is reduced. However, for a thickness smaller than $0.3\mu m$, the threshold current does not decrease prominently owing to the leakage of light into the neighboring regions. Such leakage of light is prominent when the thickness of the active region is comparable to the wavelength of light generated in the active region.

The confinement of light is dependent on the refractive index of the active region. In the conventional semiconductor DHS laser, the profile of the refractive index in the active region has not been satisfactory in the viewpoint of light confinement.

SUMMARY OF THE INVENTION

This invention decreases the threshold current of a semiconductor DHS laser. A feature of the invention is to provide the laser with an active region having such a special distribution of carrier concentration that, in the direction of thickness of the active region, the central part has the highest carrier concentration, and the farther the outer parts are apart from the central part the lower their carrier concentrations.

BRIEF EXPLANATION OF THE DRAWING

This invention will be further understood from the following detailed description and the accompanying drawings wherein.

DETAILED DISCLOSURE OF THE INVENTION

This invention is characterized by making the active region of a semiconductor DHS laser to have such a special distribution of carrier concentration that, in the direction of thickness of the active region, the central part has the highest carrier concentration, and the farther the outer parts are apart from the central part, the lower their carrier concentrations are. Such control of carrier concentrations is made by controlling the amount of impurity such as zinc in the active layer.

Figure 1:
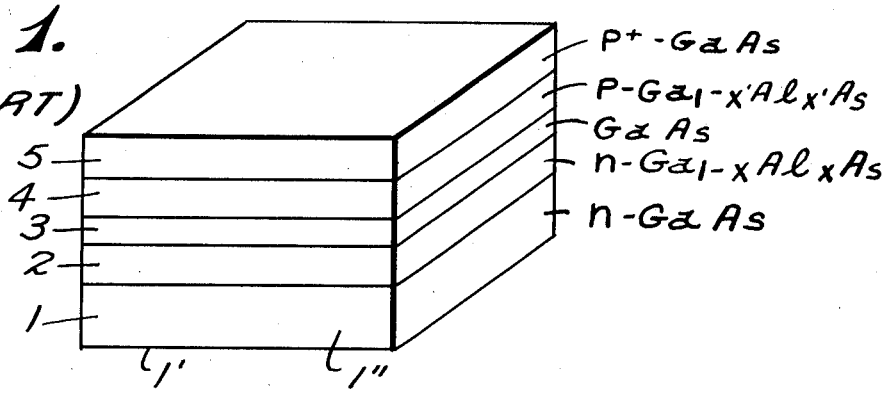
FIG. 1 is a schematic perspective view of a conventional semiconductor DHS laser.
Figure 2:
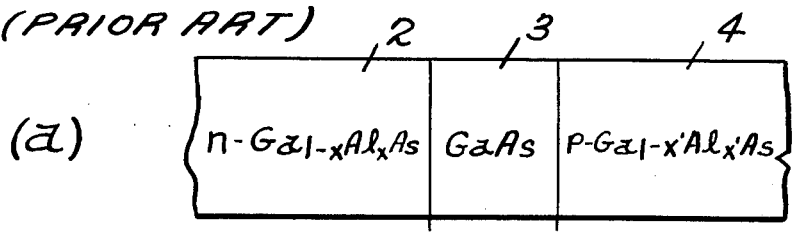
FIGS. 2(a), (b) and (c) are charts showing locations of the layers, energy levels of the layers, and refractive indexes of the layers, respectively, of the conventional laser shown in FIG. 1.
Figure 3:
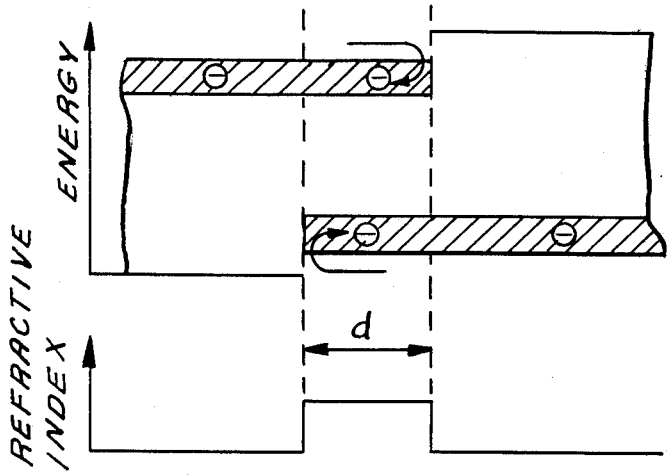
FIG. 3 is a schematic perspective view of a first example of a semiconductor DHS laser of the present invention.
Figure 3:
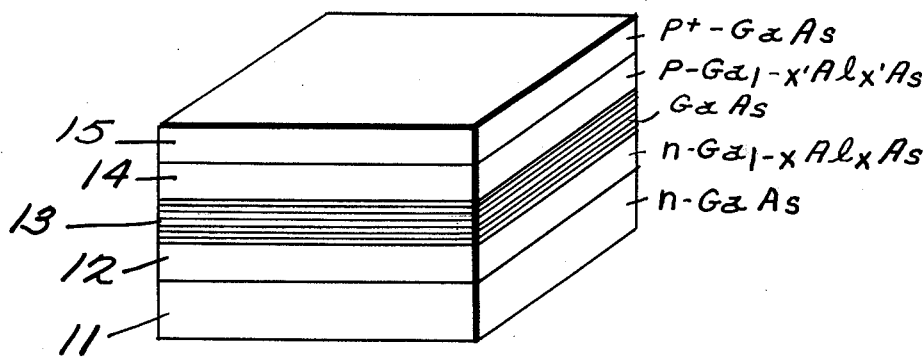

In a first example shown in FIG. 3, on the substrate 11 of n-type GaAs, a first layer 12 of n-type $Ga_{1-x}Al_xAs$ ($x=0.2$ to 0.8), a second layer, or active region 13 of GaAs, a third layer 14 of p-type $Ga_{1-x'}Al_{x'}As$ ($x'=0.2$ to 0.8) and a fourth layer, or ohmic contacting layer 15, of $p^+$-type GaAs are sequentially grown by known liquid-phase epitaxial growth. Thereupon, the above-mentioned active region 13 consists of many component layers wherein carrier concentrations of the component layer at the center is highest, and the farther the outer component layers are apart from the central component layer, the lower their carrier concentrations are. Such control of the carrier concentrations is made by controlling the concentrations of impurity doped in the component layers.

The aforementioned laser is made in the following sequential growths.

Figure 4:
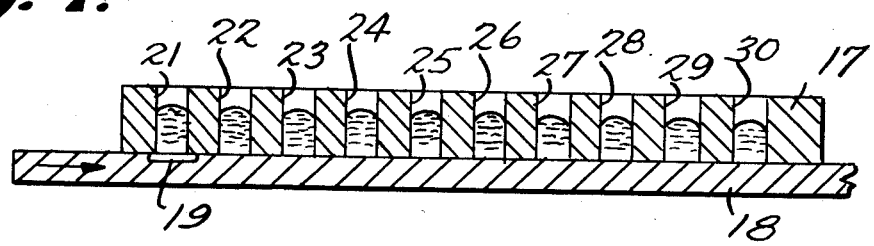
FIG. 4 is a schematic sectional elevation view of a solution holder; or boat, together with a seed holder or graphite slider for use in making the laser of FIG. 3.

Referring to FIG. 4, a solution holder or boat 17 with ten through holes 21 to 30, each containing a semiconductor solution, is slidably positioned on a seed holder, or graphite slider 18, which holds a semiconductor seed 19 of n-type GaAs. The ten through holes hold the following solutions for growing the below mentioned layers:

| Holes | Solution | Layers Grown | | Concentration of carrier in grown component layers (atoms/cm³) |
|---|---|---|---|---|
| 21 | Sn-doped $Ga_{1-x}Al_xAs$ | 12 | $n-Ga_{1-x}Al_xAs$ | $2 \cdot 10^{18}$ |
| 22 | Zn-doped GaAs | 31 | GaAs | Below $10^{16}$ |
| 23 | Zn-doped GaAs | 32 | GaAs | $10^{16}-10^{17}$ |
| 24 | Zn-doped GaAs | 33 | GaAs | $10^{17}-10^{18}$ |
| 25 | Zn-doped GaAs (active layer 13) | 34 | GaAs | $10^{18}-10^{19}$ |
| 26 | Zn-doped GaAs | 35 | GaAs | $10^{17}-10^{18}$ |
| 27 | Zn-doped GaAs | 36 | GaAs | $10^{16}-10^{17}$ |
| 28 | Zn-doped GaAs | 37 | GaAs | Below $10^{16}$ |
| 29 | Zn-doped $Ga_{1-x'}Al_{x'}As$ | 14 | $p-Ga_{1-x'}Al_{x'}As$ | $1 \cdot 10^{18}$ |
| 30 | Zn-doped GaAs | 15 | $p^+$-GaAs | $5 \cdot 10^{18}$ |

As seen from the aforementioned table, the solution in the central hole 25 is doped highest, and the outer holes are doped the lowest.

The sequential epitaxial growths on the n-type GaAs seed 19 are made, starting from 850° C for the first layer 12 downwards, with a cooling rate of 1° C per minute, by sliding the graphite slider 18 to the right in FIG. 4. The cooling period for epitaxial growth is 20 minutes for the first layer 12 of $n-Ga_{1-x}Al_xAs$, 8 seconds each for each of the component layers 31 to 37 in the active region 13, 1 minute for the third layer 14 of $p-Ga_{1-x'}Al_{x'}As$, and 3 minutes for the fourth layer 15 of $p^+$-GaAs.

Figure 5:
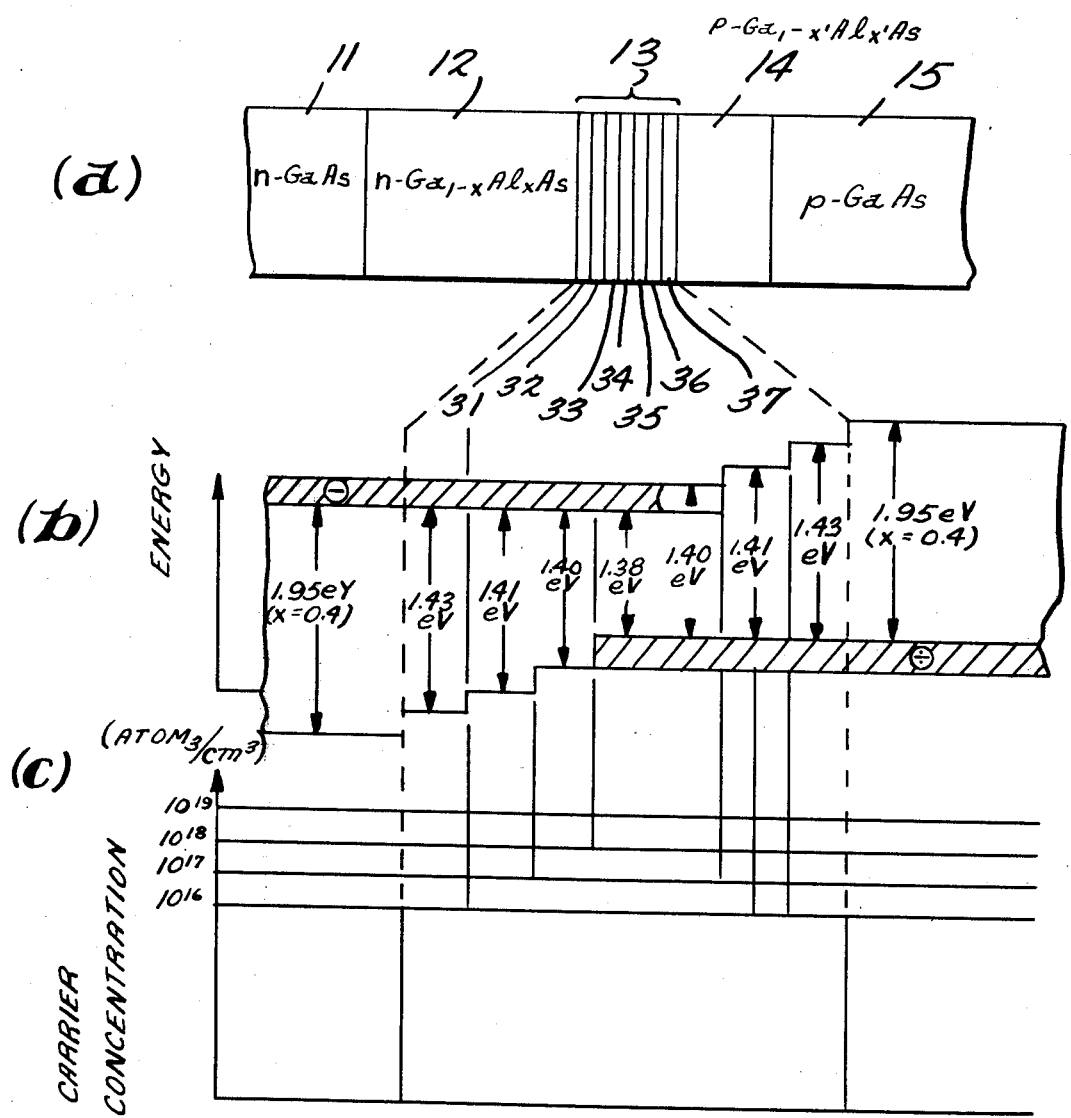
FIG. 5(a), (b) and (c) are charts showing locations of layers, energy levels of the layers and carrier concentrations of the layers, respectively, of the laser of FIG. 3.

The principal part of the laser made in the aforementioned processes is shown in FIG. 5(a) which is an abridged sectional view of the grown layers. As shown in this figure, the active region 13 consists of seven component layers 31 to 37. Each component layer is about $0.15\mu$ thick, and therefore, the active region 13 is about m $1.05\mu m$ thick. Incidentally, the first and third layers are roughly $2.5\mu m$ and $1\mu m$ thick, respectively.

The energy level distribution of this laser is shown in FIG. 5(b). In GaAs, the higher the carrier concentration is the narrower the effective energy gap is. This is due to the deep band tailing in high carrier concentration material. The carrier concentrations of the component layers 31 to 37, show pyramid-like distribution as shown in FIG. 5(c). Such pyramidal profile of carrier concentration effectively confines the laser light to around the central component layer in the active region, and therefore, decreases leakage of light to neighboring layers.

Figure 8:
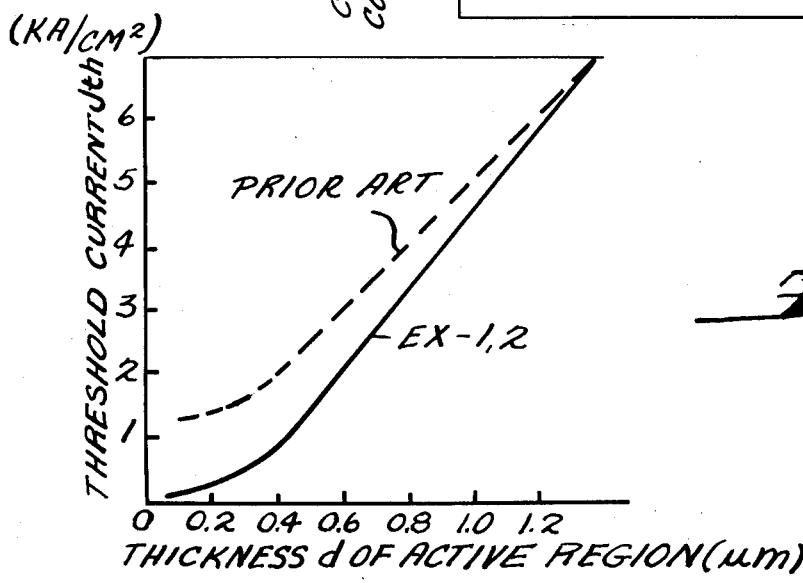
FIG. 8 is a graph showing the relation between thickness "d" of the active region and threshold current of the lasers of Examples 1 and 2 (solid line), together with that of the conventional laser (dotted line).

The aforementioned laser of the first example attains a threshold current density as low as only 100 A/cm² at the lowest condition, which low value has never been attainable with the conventional laser. The relation between the thickness "d" of the active region 13 and the threshold current density Jth is shown in FIG. 8, wherein solid curve indicates characteristic of the laser of this example, while dotted line indicates that of the prior art. The laser light of this example has the wavelength of 9000 A.

The reason for the above-mentioned decrease of the threshold current is thought to be that any laser light radiated in the outer component layers 31 to 33 and 35 to 37 by recombination of carriers therein is absorbed in the central layer 34 and excites the central layer 34 to radiate the laser light therefrom. This supposition is confirmed by an observation of "near field pattern", which implies electromagnetic field distribution at the reflective mirror of the laser.

In accordance with this invention, the energy band structure of the active region of the laser is obtained by controlling only the carrier concentration. Therefore, in the active region, only the carrier concentration changes between the central portion and adjacent side portions of the active region -- the composition or alloying components do not change. Thus in the active region of the laser of the present invention, the lattice constant is substantially the same all the way through the active region. This results in a more uniform crystal structure throughout the active region, and provides a higher lasing efficiency in comparison to structures wherein the composition or alloying components vary in the active region.

The refractive index of light in the laser of the present invention does not significantly change in response to the variation of carrier concentration. It can be regarded as substantially constant all the way through the active region. Therefore, the light lased in the active region is not concentrated in a very narrow central portion of the active region as is the case for some prior art constructions, but on the contrary is spread throughout the active region. Accordingly, no adverse temperature rise occurs in the central portion of the active region and larger peak power than in the prior art can be obtained.

Furthermore, since the refractive index of the active region is substantially constant throughout the active region, a larger difference of refractive index is obtained at the boundary between the active region and the neighboring regions than in the prior art. Because of this large difference of refractive index at the boundaries, better light confinement in the active region is obtained.

According to the above-described advantages of this invention, a higher lasing efficiency is obtained, along with a smaller threshold current. Additionally, a higher power laser output is also obtained.

The second example is characterized in that a heat treatment is made so as to obtain bell shaped distribution of carrier concentration in its active region.

Figure 6:
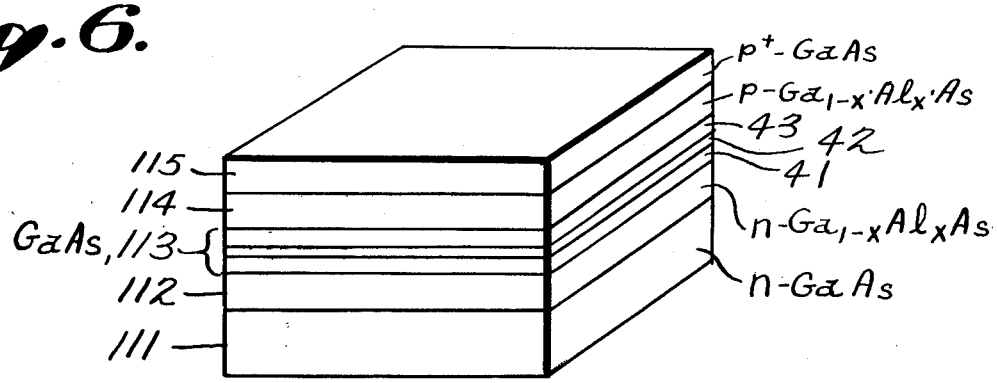
FIG. 6 is a schematic perspective view of a second example of a semiconductor DHS laser of the present invention.

In FIG. 6, which shows the second example, on the substrate 111 of n-type GaAs, a first layer 112 of n-type $Ga_{1-x}Al_xAs$, ($x = 0.2$ to $0.8$), a second layer, or active region 113, of GaAs, a third layer 114 of p-type $Ga_{1-x'}Al_{x'}As$ ($x' = 0.2$ to $0.8$), and a fourth layer, or ohmic contacting layer 115, of $p^+$-type GaAs are sequentially grown by known liquid-phase epitaxial growth. The above-mentioned active region 113 consists of a central layer 42 of high carrier concentration sandwiched by outer layers 41 and 42 of lower carrier concentration.

Such laser is made by sequential epitaxial growths using the following semiconductor solutions in a boat having the following six through holes for solutions.

| Holes | Solutions | | Layers Grown | Concentration of carrier in grown component layers (atoms/cm³) |
|---|---|---|---|---|
| first | Sn-doped $Ga_{1-x}Al_xAs$ | | 112 $nGa_{1-x}Al_xAs$ | $2 \cdot 10^{18}$ |
| second | non-doped GaAs | (active layer 113) | 41 GaAs | 0 to $10^{18}$ (inclined) |
| third | Zn-doped GaAs | | 42 GaAs | $10^{18}$ |
| fourth | non-doped GaAs | | 43 GaAs | $10^{18}$ to 0 (inclined) |
| fifth | Zn-doped $Ga_{1-x'}Al_{x'}As$ | | 114 $p\text{-}Ga_{1-x'}Al_{x'}As$ | $1 \cdot 10^{18}$ |
| sixth | Zn-doped GaAs | | 115 $p^+\text{-}GaAs$ | $5 \cdot 10^{18}$ |

As is seen from the aforementioned table, the solution in the third hole, which is for growing the central component layer 42 of the active layer 113, is highly doped with Zn, while the solutions in the second and fourth holes are not doped.

Sequential growths on the substrate 111 are made starting from 850° C for the first layer 112 downwards, with a cooling rate of 1° C per minute. The cooling period for epitaxial growth is 20 minutes for the first layer 112 of n-$Ga_{1-x}Al_xAs$, 24 seconds each for each of outer component layers 41 and 43 of non-doped GaAs, 8 seconds for the central component layer 42 of high-doped GaAs, 1 minute for the third layer 114 of p-$Ga_{1-x'}Al_{x'}As$, and 3 minutes for the fourth layer 115 of $p^+$-GaAs. Then the element is heat-treated at the temperature of 800° C for 30 minutes. As a result of the heat-treatment the dopant Zn is diffused from the central component layer 42 into the outer component layers 41 and 43, making a bell-shaped profile of the carrier concentration in the active region 13 is as shown in FIG. 7(b).

Figure 7:
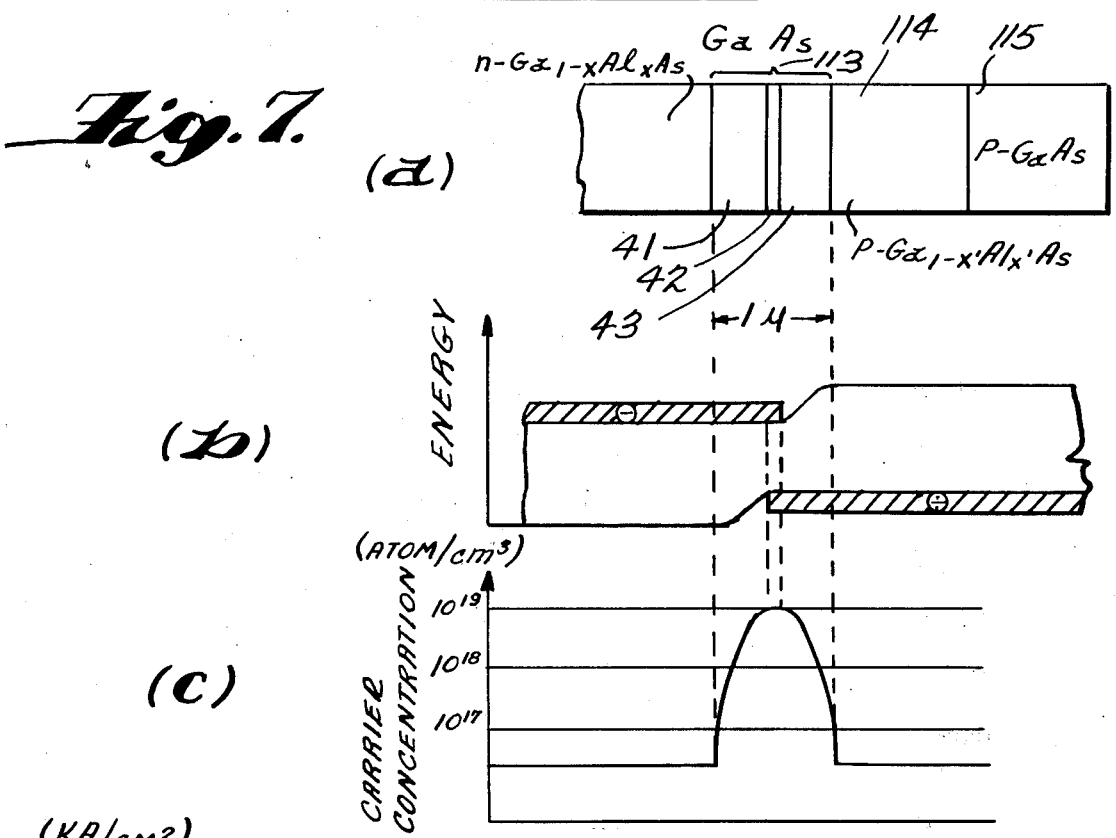
FIGS. 7(a), (b) and (c) are charts showing locations of the layers, energy levels of the layers and carrier concentrations of the layers, respectively, of the laser of FIG. 6.

The energy level distribution of this laser is shown in FIG. 7(b).

The bell-shaped distribution of the refractive index effectively confines the laser light to around the central component layer in the active regions, and therefore, decreases leakage of light into neighboring layers.

The aforementioned laser of the second example attains a threshold current density as low as only 100A/cm² at the lowest condition, which low value has never been attainable with the conventional laser. The wavelength of the laser of this example is 9000 A.

While the novel embodiments of the invention have been described, it will be understood that various omissions, modifications and changes in these embodiments may be made by one skilled in the art without departing from the spirit and scope of the invention.

What is claimed is:

1. In a semiconductor laser of double heterostructure including an active layer of GaAs having more than two component layers, the improvement comprising: the central component layer having the highest carrier concentration and the outer component layers having lower carrier concentrations, with the further the outer component layers are from the central component layer the lower their carrier concentrations being.

2. A semiconductor laser of double heterostructure, comprising:
a substrate of GaAs of one conductivity type,
a first epitaxially grown layer of $Ga_{1-x}Al_xAs$ of said one conductivity type, the first layer being on the substrate,
an active region of GaAs of the one conductivity type having more than two component layers, with specified carrier concentrations, respectively, the active region being on the first layer, the central component layer having the highest carrier concentration, and the farther the outer parts of said active region being apart from the central component layer the lower are their carrier concentrations,
a third epitaxially grown layer of $Ga_{1-x}Al_xAs$ of the conductivity type opposite to those of the substrate and the first grown layer, the third layer being on the active region, and
a fourth epitaxially grown layer of GaAs of the same conductivity type with the third layer, the fourth layer being on the third layer.

* * * * *